United States Patent [19]

Shiromizu

[11] Patent Number: 4,914,493
[45] Date of Patent: Apr. 3, 1990

[54] CCD (CHARGE COUPLED DEVICE) SOLID-STATE IMAGE PICKUP ELEMENT

[75] Inventor: Yasuyuki Shiromizu, Tokyo, Japan

[73] Assignee: Fuji Electric Co., Ltd., Kawasaki, Japan

[21] Appl. No.: 72,682

[22] Filed: Jul. 13, 1987

[30] Foreign Application Priority Data

Jul. 14, 1986 [JP] Japan .................. 61-163895
Nov. 28, 1986 [JP] Japan .................. 61-281648

[51] Int. Cl.⁴ .................. H01L 29/78; H01L 27/14; H01L 31/00
[52] U.S. Cl. .................. 357/24; 357/30
[58] Field of Search .................. 357/24, 30

[56] References Cited

U.S. PATENT DOCUMENTS 4,242,599 12/1980 Suzuki .................. 357/24 LR
4,696,021 9/1987 Kawahara et al. .................. 357/24 LR
4,743,778 5/1988 Takatsu et al. .................. 357/24 LR Primary Examiner—Gene M. Munson
Attorney, Agent, or Firm—Brumbaugh, Graves, Donohue & Raymond

[57] ABSTRACT

The present invention relates to a CCD (Charge Coupled Device) solid-state image pickup element with a MOS (Metal Oxide Semiconductor) structure which is used for an image input device such as a TV camera. A reset electrode is provided on the overflow control gate or on the channel stop located between the vertical transfer CCD and the overflow drain of the adjacent picture element, and signal charges on the photosensitive part are discharged through the V-CCD by applying a reset voltage to said reset electrode. Through such an operation, the shutter speed is improved by substantially curtailing the image accumulation time (exposure time) and the stationary image of a moving object can be obtained without using strobes.

6 Claims, 6 Drawing Sheets

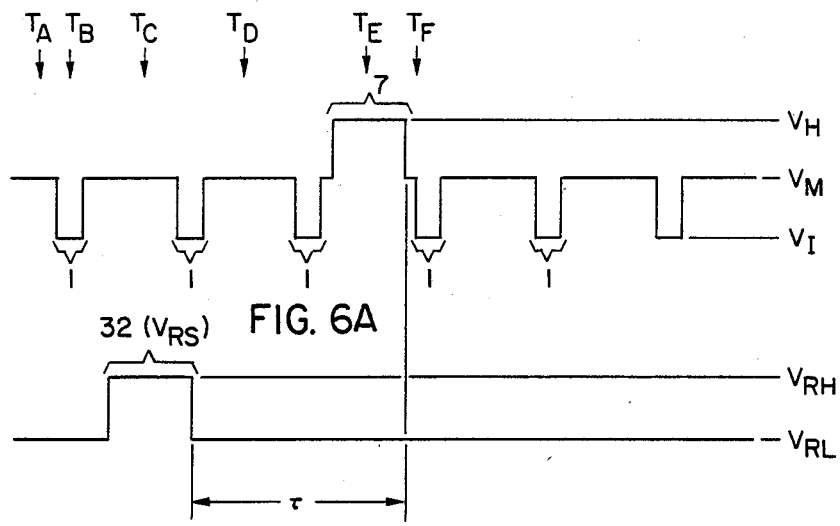
FIG. 6A
FIG. 6B
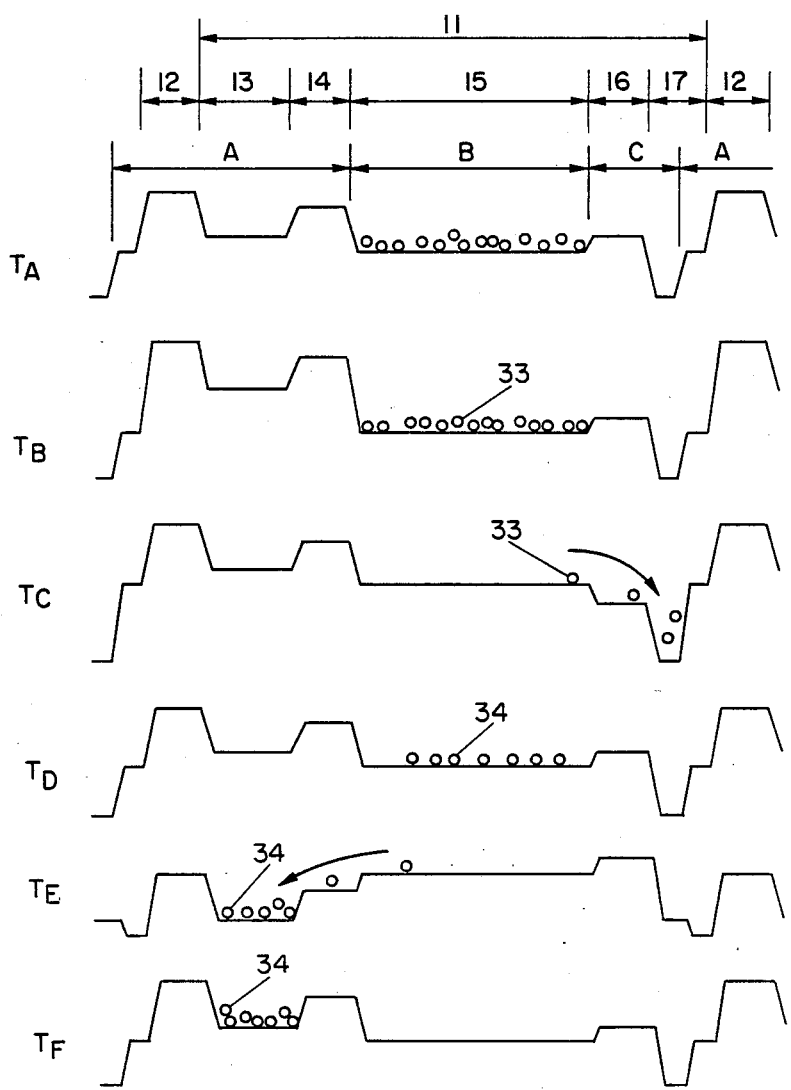
FIG. 7

CCD (CHARGE COUPLED DEVICE) SOLID-STATE IMAGE PICKUP ELEMENT

BACKGROUND OF THE INVENTION

The present invention relates to a CCD (Charge Coupled Device) solid-state image pickup element with a MOS (Metal Oxide Semiconductor) structure which is used for an image input device such as a TV camera. Reference to FIGS. 1-4 will be made in the discussion of the prior art.

FIG. 1 is a block diagram of an interline transfer type CCD solid-state image pickup element. The element includes a vertical transfer clock 1, a horizontal transfer clock 2, an image signal output 3, a photosensor 4 (light receiving part) which forms an image, a vertical (CCD) shift register 5, a horizontal (CCD) shift register 6, and a readout pulse 7.

FIG. 2 is a diagram which shows the operating procedure of the image pickup element of FIG. 1. In FIG. 2, five photosensors 4 ar arranged vertically while four photosensors 4 are arranged horizontally forming a matrix type display screen. The vertical shift registers 5 are formed by five stages, while the horizontal shift registers 6 are formed by four stages.

Referring to FIG. 2(A), the image signals $F_{ij}$ (where i=1 to 5, j=1 to 4) are being accumulated in the photosensors 4 by the exposure and such image signals are ready to be read. Therefore, the vertical shift register 5 and the horizontal shift register 6 are in the idle condition.

When the readout pulse 7 is input to the photosensors 4, the image signals $F_{ij}$, accumulated in the photosensors, are fetched by the vertical shift registers 5, one at a time, and thereafter the image signals $F_{ji}$, which form the next image are accumulated in the photosensors 4. This condition is shown in FIG. 2(B).

Next, when the vertical transfer clock 1 inputs a pulse to the vertical shift registers 5, contents of the first stage $F_{11}$, $F_{12}$, $F_{13}$, and $F_{14}$ of the vertical shift registers 5 are transferred to the horizontal shift register 6. The condition after such a transfer is shown in FIG. 2(C).

Thereafter, when the horizontal transfer clock 2 inputs a number of pulses equal to the number of lateral picture elements (four, in this example) to the horizontal shift register 6, the contents of horizontal shift register 6 can be extracted in series at the image signal output 3. The condition after such an extraction is shown in FIG. 2(D).

Contents of the vertical shift registers 5 and horizontal shift registers 6 can all be read by repeating such readout operations by as many times as the number of vertical picture elements (five, in this example). Thereby, the readout of the image signals of one field, forming one frame, (in the non-interlace system) (one frame is formed by the image signals of two fields in the interlace system) by the raster scan system is completed.

FIG. 3(a) is a sectional view indicating the vertical sectional structure of the part M of FIG. 1, which includes the corresponding part of one photosensor 4 and one stage of the vertical shift register 5 also of FIG. 1 (in other words, the picture element structure of a MOS type CCD which provides the overflow drain structure for eliminating excessive signal charges which will result in blurring or smearing.

FIG. 3(b) indicates the energy level distribution in the above structure at time $t_1$ and FIG. 3(c) indicates energy level distribution in the same structure at the time $t_2$.

In FIG. 3, is included a picture element region 11, a channel stop 12, the input of one stage of the V-CCD 13 (corresponding to vertical shift register 5 of FIG. 1), a readout gate 14, a photosensitive part 15, a overflow control gate 16, an overflow drain 17, an optical shield of aluminum 18, a transparent electrode 19, insulation film 20, an electrode 21, a signal charge 22, and an overflow charge 23.

The signs "+" or "−" in the symbols are indications of P+, N+, and P− which indicates the doping concentration. The sign "+" means relatively high doping concentration, while "−" means relatively low doping concentration. P indicates a P type semiconductor, while N indicates an N type semiconductor. As shown, the bulk of the semiconductive substrate 40 in which the different regions are formed is P-type of relatively low doping.

FIG. 4 is a timing diagram of the vertical transfer clock 1 and a readout pulse 7 which is applied to the element structure indicated in FIG. 3(a).

The operations involving FIG. 3 and FIG. 4 are explained as follows. In FIG. 3(a), a bias voltage $V_{SG}$ is applied to the transparent electrode 19 by any means well known in the art. The vertical transfer clock 1 and readout pulse 7 are input to the electrode 21. When the vertical transfer clock 1 and readout pulse 7 are combined, the signal having three values ($V_H$, $V_M$, $V_L$) as indicated in FIG. 4 is obtained.

The distribution of energy levels, where signal charges are accumulated, (for example, at time $t_1$ of FIG. 4 in reference to FIG. 3(a) is indicated in FIG. 3(b). At time $t_1$, when the readout pulse 7 is not applied, a bias voltage $V_{SG}$ is applied to the transparent electrode 19 and the energy level is lowered by as much as a certain level width $V_{SG}'$ corresponding to the bias voltage $V_{SG}$ at the area between the photosensitive part 15 and the overflow drain 17. As a result, a well for accumulating charges is formed.

When the vertical transfer clock 1 is applied to the electrode 21, the energy level is lowered by as much as the level width $V_M'$ or $V_L'$ which corresponds to voltage levels $V_M$ or $V_L$ of the transfer clock 1, at the area between the overflow drain 17 and the readout gate 14. As a result, a well for accumulating charges is formed.

Here the following relation exists as is apparent from FIG. 4.

$$V_M' > V_L'$$

In FIG. 3(b), when a voltage barrier generated at the junction area between the photosensitive part 15 and the overflow control gate 16 is assumed as $P_B$, while $V_{SG}' - V_M' = P_A$, then the relation $P_A > P_B$ can be obtained.

When the light is incident on the solid-state image pickup element, electrons are excited at the areas not covered with the optical shield 18, which is made of aluminum, and said electrons are accumulated in the charge well of the photosensitive part 15.

The amount of charges accumulated in this well is limited by the voltage barrier $P_B$. The charges 23, overflowing said barrier $P_B$, flow to the overflow drain 17, passing the overflow control gate 16, and are finally discharged to the outside of the image pickup element.

Usually the voltage barrier $P_B$ is determined so that the amount of charges on the photosensitive part 15 does not exceed the amount of charges to be handled by V-CCD 13. Its size is determined by the difference between the impurity concentrations of the semiconductor which forms the photosensitive part 15 and the semiconductor which forms the overflow control gate 16.

The effect of time $t_2$, where the readout pulse is applied, is explained with reference to FIG. 3(c). When the readout pulse 7 is applied to the electrode 21, the level is lowered as much as the level width $V_H'$ in accordance with the voltage $V_H$ of said pulse 7 at the area between the overflow drain 17 and readout gate 14 (when $V_H' - V_M' = P_c$, the energy level is further lowered to as much as the voltage barrier $P_c$ in comparison with FIG. 3(b)).

In this case, the following condition is necessary.

$$V_H' \geq V_{SG'}$$

Thereby, the energy level of readout gate 14 is lower than that of the photosensitive part 15 and the signal charges 22 flow into V-CCD 13 passing through the readout gate 14 for the read operation. Here, a channel stop 12 is provided between V-CCD 13 and the overflow drain 17 of the adjacent picture element therefore preventing the charges 22 on V-CCD 13 from leaking out.

At time $t_3$ where the vertical transfer clock 1 is applied, when $V_{SG}' - V_L' = P_A'$, since $P_A' > P_A$, the difference of the energy level between the readout gate 14 and the photosensitive part 15 becomes larger.

A CCD solid-state image pickup element of the prior art as explained previously requires the time of 1/60th of a second to read the image signals of as much as one field from the pickup element. Moreover, in the case where the image signal employs the non-interlace system, one display screen corresponds to one field (1/60 second), but in the case where the interlace system is employed, one display screen corresponds to two fields (1/30 second), and the signal charges are accumulated at the photosensitive part 15 for a period of one display screen (therefore, the period of such accumulation corresponds to the shutter speed in the case of a camera which uses a film).

The period for accumulating the signal charges continues comparatively as long as 1/60th of a second but it is not as long as the shutter speed. Therefore, the problem of blurring occur when the object is moving.

SUMMARY OF THE INVENTION

The present invention is intended to improve the shutter speed by substantially curtailing the accumulation period of the signal charges in a CCD solid-state image pickup element. It is an object of the present invention to provide a CCD solid-state image pickup element which therefore eliminates the problem of the prior art.

The present invention is characterized in that the charges being accumulated, while the light receiving part of said solid-state image pickup element is irradiated with light, are discharged to other elements by providing a reset electrode and applying a reset voltage to said reset electrode at the time before a constant period from the time for reading the image from said solid-state image pickup element, and thereafter the charges accumulated in the photosensitive part by the irradiation of light during the period before a readout pulse, are read as the image pickup signal.

The reset electrode can be provided on the overflow control gate or it can be located between the vertical transfer CCD and the overflow drain of the adjacent picture element.

BRIEF DESCRIPTION OF THE DRAWINGS

FIG. 6(a) is a timing diagram of the drive signal for the first embodiment of the present invention;

FIG. 6(b) is a timing diagram of the reset signal for the first embodiment of the present invention;

FIG. 7 indicates the energy level distribution for each specific time labeled in FIGS. 6(a) and 6(b);

DETAILED DESCRIPTION OF THE PREFERRED EMBODIMENT

The first embodiment of the present invention will be explained with reference to the accompanying drawings.

Figure 5A:
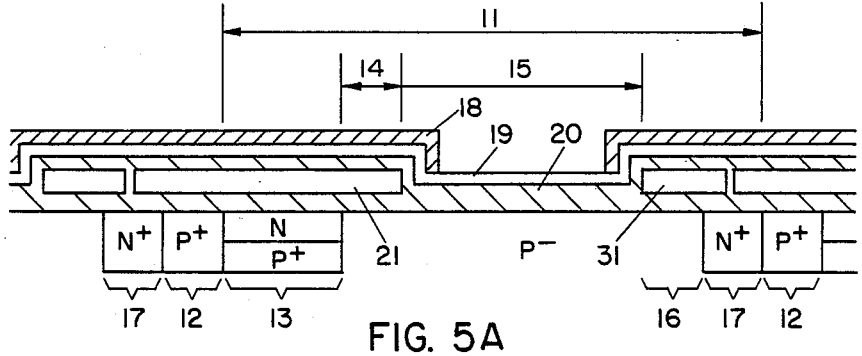
FIG. 5(a) is a sectional view indicating the first embodiment of the present invention.
Figure 5B:
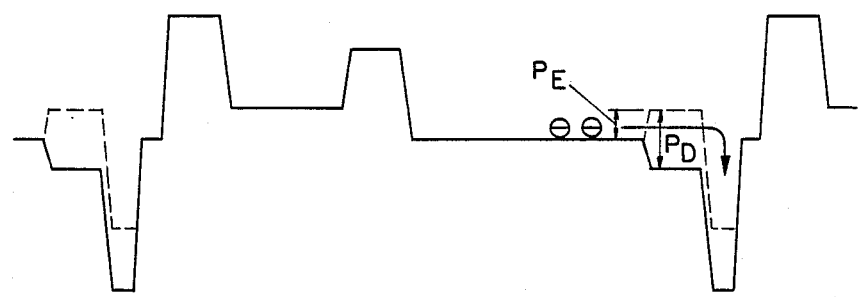
FIG. 5(b) indicates the energy level distribution of the section in FIG. 5(a)

FIG. 5(a) is a sectional view indicating an embodiment of the present invention. FIG. 5(b) indicates the energy level distribution of the same section in FIG. 5(a).

In these figures, the like elements are given like reference symbols. Namely, in FIG. 5, the reset electrode 31, which is provided for discharging the useless charges on the photosensitive part 15, through the overflow control gate 16, and over the voltage barrier $P_E$ as shown in FIG. 5(b), is controlled with the reset voltage $V_{RS}$ applied thereto. The reset voltage $V_{RS}$ is equal to $V_{RL}$ ($V_{RS} = V_{RL}$) under normal conditions, but it becomes equal to $V_{RH}$ ($V_{RS} = V_{RH}$) during the reset period.

Figure 1:
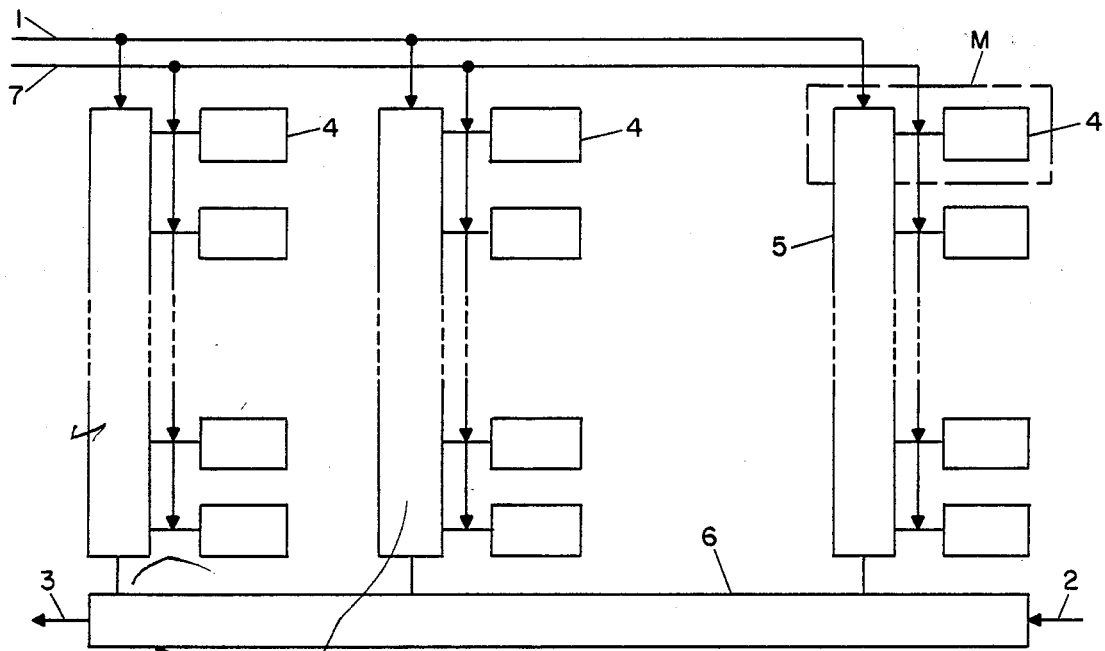
FIG. 1 is a block diagram of an interline transfer type CCD solid-state image pickup element of the prior art.
Figure 2A:
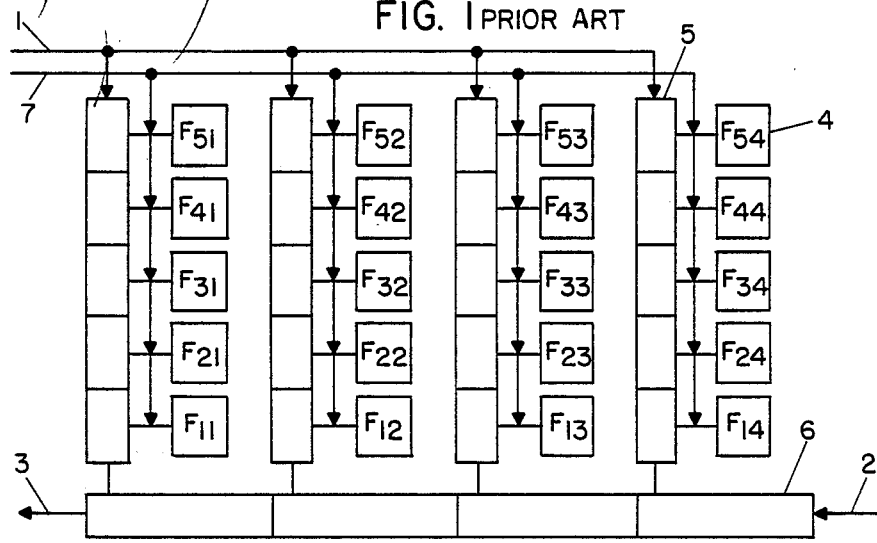
FIG. 2 is a diagram which shows the operating procedure of the image pickup element of FIG. 1.
Figure 2B:
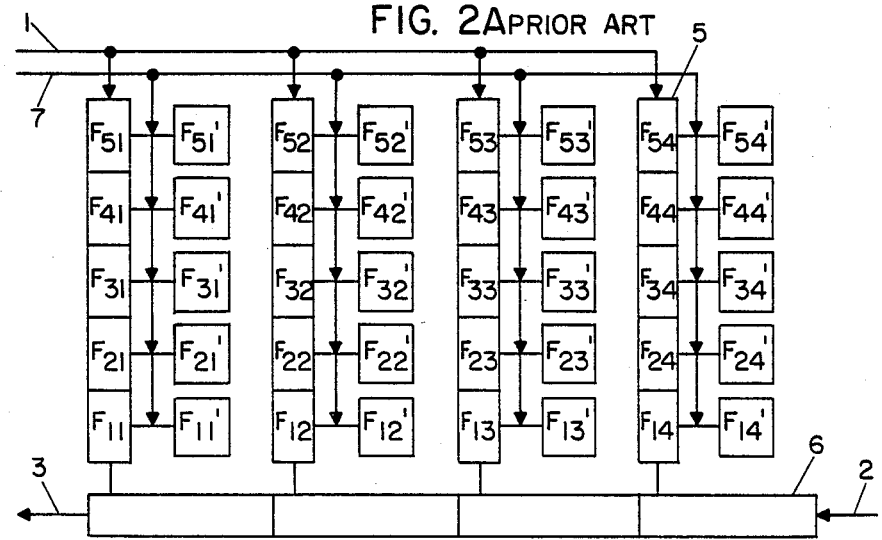
Figure 2C:
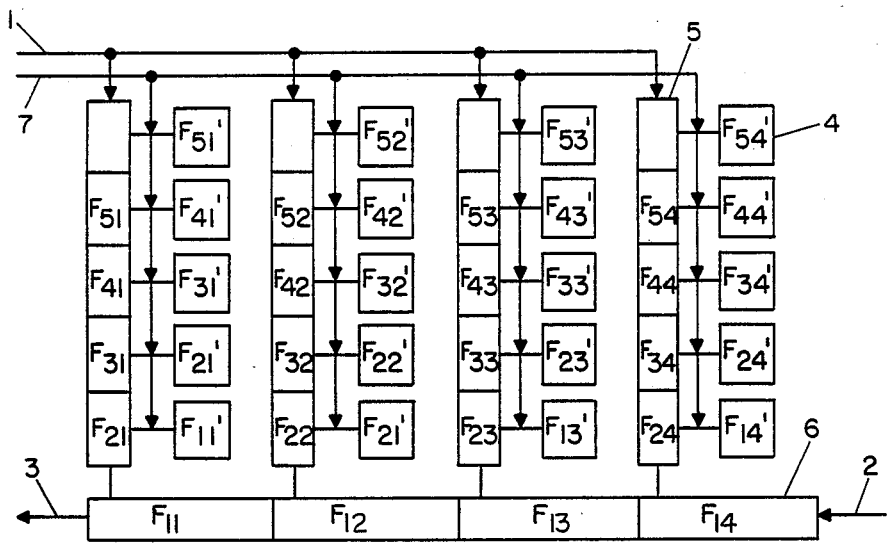
Figure 2D:
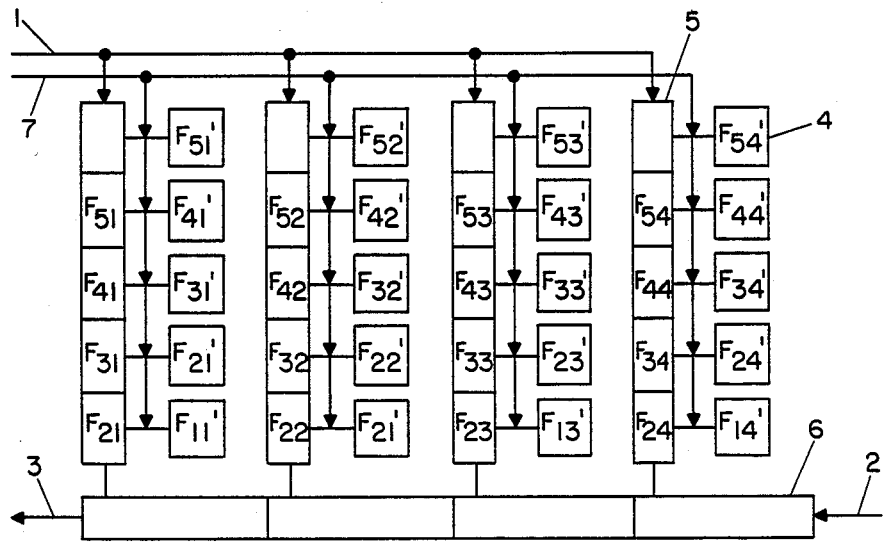
Figure 3A:
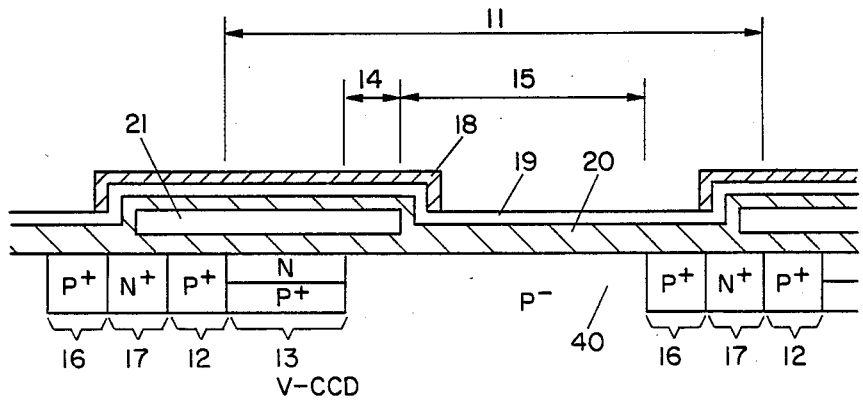
FIG. 3(a) is a sectional view indicating the vertical sectional structure of the part M of FIG. 1 which includes the corresponding part of one photosensor and one stage of the vertical shift register.
Figure 3B:
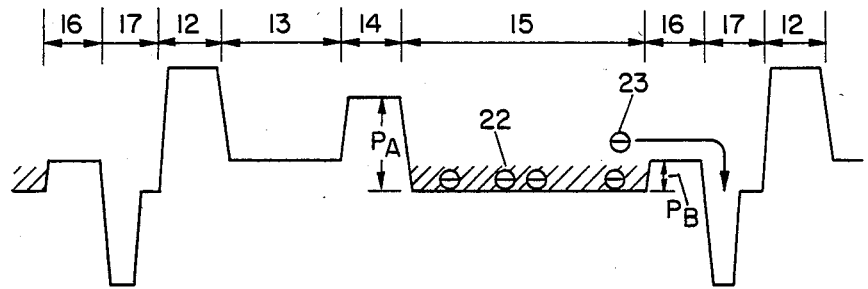
FIG. 3(b) indicates the energy level distribution at a time $t_1$ of the structure shown in FIG. 3(a)
Figure 3C:
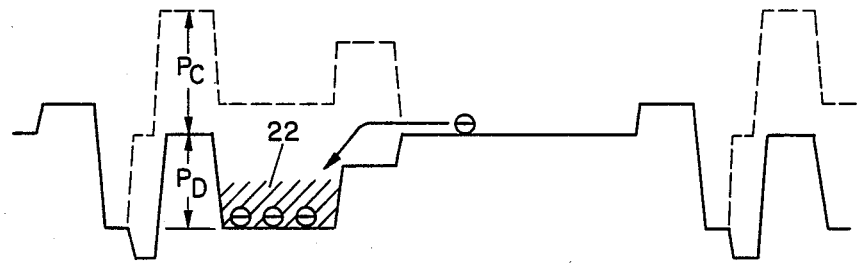
FIG. 3(c) indicates the energy level distribution at a time $t_2$ of the structure shown in FIG. 3(a)
Figure 4:
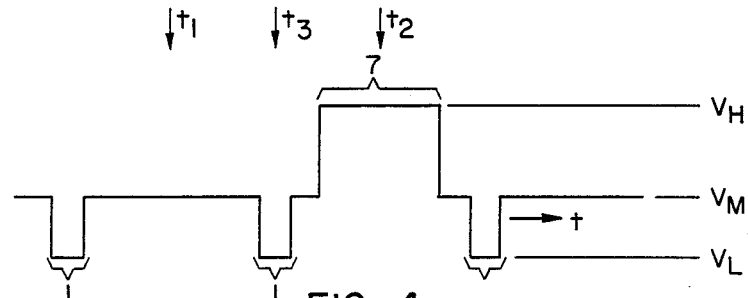
FIG. 4 is a timing diagram of the vertical transfer clock and readout pulse.

Therefore, it is no longer necessary to form the P+ semiconductor region on the overflow control gate 16, as was shown in FIG. 3(a).

Normal operations are carried out as follows. Namely, the energy level is lowered in accordance with the voltage level $V_H$ of the readout pulse 7, the voltage levels $V_M$, $V_L$, of the vertical transfer clock 1, bias voltage $V_{SG}$ of the photosensitive part 15 and the reset voltage $V_{RS}$ (=$V_{RL}$) which is applied to the reset electrode 31. The lowering of the depth for such an energy level is respectively considered as $V_H'$, $V_M'$, $V_L'$, $V_{SG}'$, $V_{RS}'$ (=$V_{RL}'$), and the following relation is obtained in the ordinary operation (other than the reset operation).

$$V_H' \geq V_{SG}' > V_{RS}' > V_M' > V_L' \quad (a)$$

When this relation is established, the operations are the same as those of the prior art. The maximum amount of signal charges on the photosensitive part 15 is limited by $V_{SG}' - V_{RS}' = P_E$.

The reset operation is next explained. When the voltage $V_{RS}$ applied to the reset electrode 31 is raised up to $V_{RS}=V_{RH}$, the energy level of the overflow control gate 16 is further lowered by as much as the corresponding level width, (equal to $P_D$ in FIG. 5(b)) and charges on the photosensitive part 15 flow out of the overflow drain 17, (pass the overflow control gate 16) and are then discharged to the outside of the image pickup element.

Here the following relation exists $$V_{RS}' \geq V_{SG}' > V_M' > V_L' \quad (b)$$

A voltage $V_H$ is not applied in this case to the electrode 21, so signal charges do not flow into V-CCD 13.

FIG. 6(a) is a timing diagram of the drive signal for the first embodiment of the present invention indicated in FIG. 5 and FIG. 6(b) is a timing diagram of the reset signal. FIG. 7 indicates the energy level distribution for each specific time labeled in FIG. 6.

The operations during image pickup are explained with reference to FIGS. 5–7.

In FIG. 6, the vertical transfer clock 1 is applied to the electrode 21, while the reset signal $V_{RS}$) 32 is the input to the reset electrode 31. A constant bias voltage $V_{SG}$ is applied to the transparent electrode 19.

In FIG. 7, the change of energy level is respectively determined by the vertical transfer clock 1 at region A, or by the bias voltage $V_{SG}$ at region B or by the reset signal ($V_{RS}$) 32 at region C.

(1) Operations at times $T_A$ to $T_B$ are only intended to drive V-CCD 13 under the said condition of equation (a) (where, $V_{RS}=V_{RL}$)

(2) The reset signal 32 is the input at time $T_c$ (in this case, $V_{RS}=V_{RH}$) and signal charges 33 on the photosensitive part 15 are discharged. At this time the energy level of the overflow control gate 16 must be lower than the energy level of the photosensitive part 15. If not, the signal charges on the photosensitive part 15 will not be discharged completely (equation (b) which was explained previously is established). This reset operation does not influence the operations of V-CCD 13.

(3) The time $T_D$ indicates the condition where the reset operation is complete. Now the signal charges 34 are generated and accumulated continuously on the photosensitive part 15.

(4) The time $T_E$ indicates the input timing of the readout pulse 7. At that time, the charges 34 on the photosensitive part 15 shift to V-CCD 13.

(5) The time $T_F$ indicates the condition immediately after the readout pulse 7, namely the condition after the end of the readout operation. It is obvious that the signal charges flowing into V-CCD 13 are generated during the period $\tau$ (FIG. 6) which extends from the end of the reset signal 32 to the end of the readout pulse 7.

Accordingly, the accumulation period for the image charges (exposure time) is defined as $\tau$. A stationary image can be obtained, even if an object is moving, by curtailing such a period ($\tau$). This can be accomplished by changing the timing of the reset signal 32.

In addition, since the reset operation does not have any effect on the drive (transfer) of the vertical shift register V-CCD to extract the signal charges, the exposure time $\tau$ can be determined without the limitation of the drive timing of V-CCD.

The second embodiment of the present invention will be explained as follows.

Figure 8A:
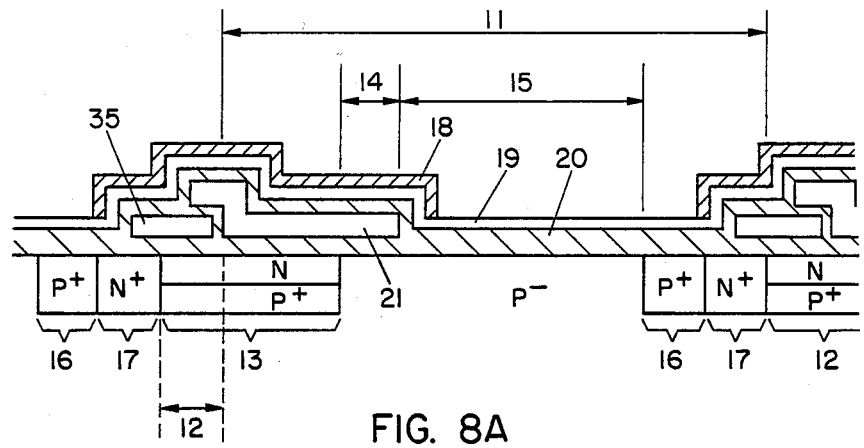
FIG. 8(a) is a sectional view indicating the second embodiment of the present invention.
Figure 8B:
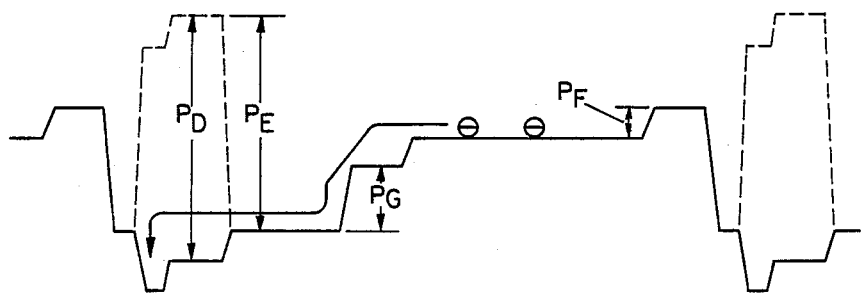
FIG. 8(b) indicates the energy level distribution of the section in FIG. 8(a)

FIG. 8(a) is a sectional view indicating an embodiment of the present invention and FIG. 8(b) indicates the energy level distribution of the same sectional view.

In these figures, the like elements are given like reference symbols. Namely, in FIG. 8, the reset electrode 35 is newly provided on the existing channel stop 12 in order to discharge the charges on V-CCD 13. The voltage barrier $P_D$ in FIG. 8(b) is controlled by the voltage $V_{RS}$ which is applied to said electrode.

In other words, it is no longer necessary to form the existing channel stop 12 by providing the reset electrode 35 for controlling the voltage barrier PD In FIG. 8(a), the structure of the existing channel stop 12 is modified to the same structure as V-CCD 13.

The normal operations are explained as follows. Namely, the energy level is lowered in accordance with the voltage level $V_H$ of the readout pulse 7, the voltage levels $V_M$, $V_L$, of the vertical transfer clock 1, the bias voltage $V_{SG}$ of the photosensitive part 15, and the reset voltage $V_{RS}$, which is applied to the reset electrode 35. Such lowering depth is respectively considered as $V_H'$, $V_M'$, $V_L'$, $V_{SG}'$, $V_{RS}'$ and the following relation can be attained under the normal operation (other than the reset operation).

$$V_H' \geq V_{SG}' > V_M' > V_L'$$

$$V_H' > V_{RS}',\ V_M' > V_{RS}',\ V_L' > V_{RS}'$$
$$(V_{SG}' - V_M') > P_F \quad (a)$$

When these relations are established, the normal operation is carried out. The maximum amount of signal charges on the photosensitive part 15 is limited by the voltage barrier $P_F$. In addition, it is apparent from the above relations that the lowering depth $V_{RS}'$ of the energy level which is lowered by the reset voltage $V_{RS}$ which is applied to the reset electrode 35, is always smaller than that of the vertical transfer clock ($V_H'$ or $V_M'$ or $V_L'$).

The reset operation is next explained. When the voltage $V_{RS}$ applied to the reset electrode 35 is raised, the energy level at the region corresponding to the channel stop 12 is lowered in proportion to the voltage rise ($P_D$ in FIG. 8(b)), and the charges on V-CCD 13, (at this time, channel stop 12) flow to the overflow drain 17 of the adjacent picture element and are then discharged to the outside of the image pickup element.

Here, the following relations are established.

$$V_{RS}' \geq V_H' \text{ or } V_{RS}' \geq V_M' \text{ or } V_{RS}' \geq V_L' \quad (b)$$

In this case, when $V_H' \geq V_{SG}'$ (during the input of the readout pulse), the signal charges on V-CCD 13 and the photosensitive part 15 can be discharged simultaneously (reset of photosensitive part 15).

this case, the following relations are set.

$$V_{RS}' \geq V_H' \geq V_{SG}' \quad (b)$$

Figure 9A:
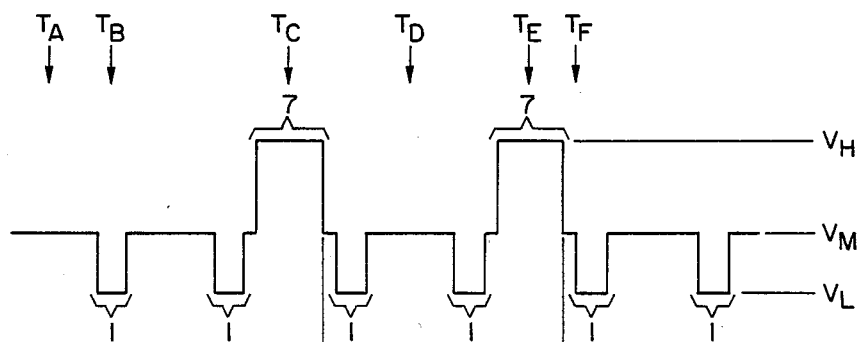
FIG. 9(a) is a timing diagram of the drive signal for the second embodiment of the present invention.
Figure 9B:
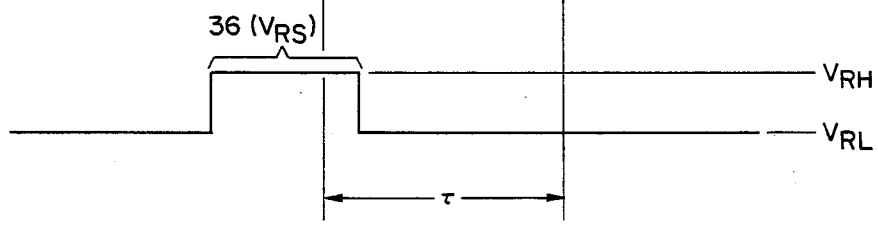
FIG. 9(b) is a timing diagram of the reset signal for the second embodiment of the present invention.

FIG. 9(a) is a timing diagram of the drive signal for the embodiment of the present invention shown in FIG. 8 and FIG. 9(b) is a timing diagram of the reset signal. FIG. 10 indicates the energy level distribution for each specific time labeled in FIG. 9.

The operations during image pickup are explained with reference to FIGS. 8-10.

In FIG. 9, the vertical transfer clock 1 is applied to the electrode 21 and the reset signal ($V_{RS}$) 36 is input to the reset electrode 35. A constant bias voltage $V_{SG}$ is applied to the transparent electrode 19.

In FIG. 10, the change of energy level is determined respectively by the vertical transfer clock 1 at region A, or by the bias voltage $V_{SG}$ at region B or by the reset signal ($V_{RS}$) 36 at region C.

Figure 10A:
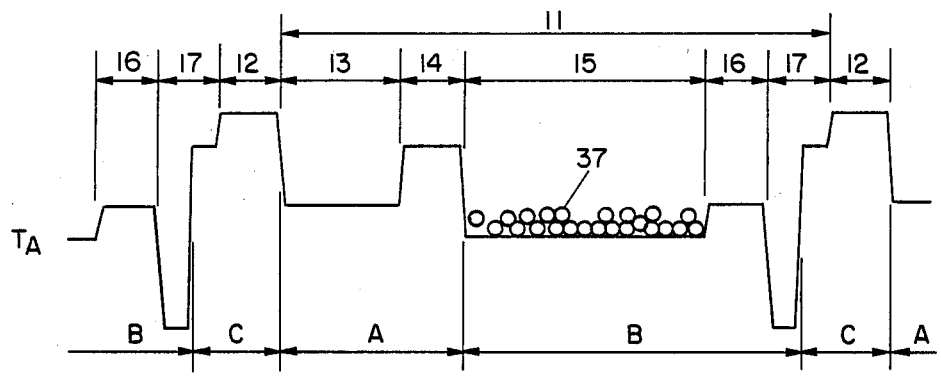
FIG. 10 indicates the energy level distribution for each specific time labeled in FIGS. 9(a) and 9(b).
Figure 10B:
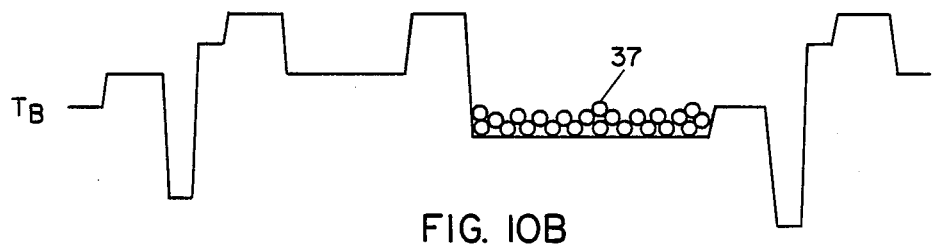

(1) Operations at Times $T_A$ to $T_B$ are only intended to drive V-CCD 13 as indicated in FIGS. 10(a),(b). In this case, the condition of equation (a) is established.

1 When the energy level width lowered by the voltage of the vertical transfer clock $1 = V_M'$, $$V_M' > V_{RS}'$$

$$(V_{SG}' - V_M') > P_F$$

2 When the energy level width lowered by the voltage of the vertical transfer clock $1 = V_L'$, $$V_L' > V_{RS}'$$

$$V_{SG}' > V_M' > V_L'$$

Figure 10C:
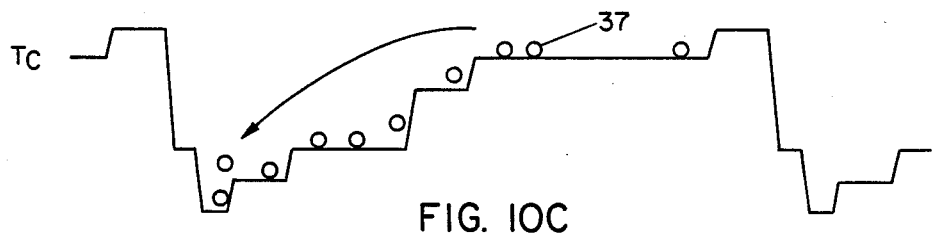

(2) The reset voltage pulse 36 is input at the time $T_c$, (in this case, $V_{RS} = V_{RH}$) Here, as indicated in FIG. 10(c), the vertical transfer clock 1 discharges the signal charges 37 on the photosensitive part 15 by inputting the readout pulse 7 ($V_H$). In this case, the said condition of equation (b)' is established. Namely, $$V_H' \geq V_{SG}'$$

(the signal charges 37 are transferred to V-CCD 13 from the photosensitive part 15)

$$V_{RS}' \geq R_H'$$

(the signal charges 37 are discharged to the outside of the element from V-CCD 13)

Figure 10D:
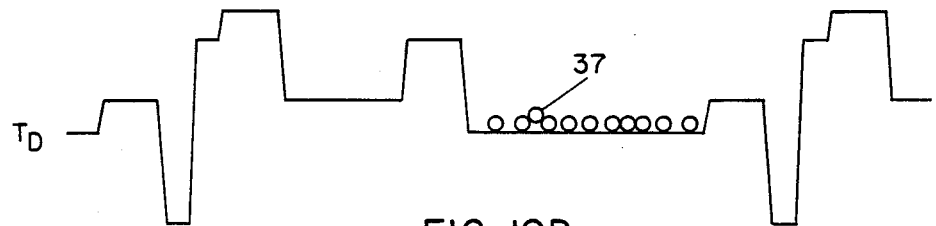

(3) The time $T_D$ indicates the condition at the end of the reset operation as indicated in FIG. 10(d). The signal charges 37, generated at the end of the reset operation, are continuously accumulated on the photosensitive part 15.

(4) The time $T_E$ indicates the input timing of the readout pulse 7. In this case, the condition of said equation (a) is set.

$$V_H' > V_{RS}'$$

$$V_H' \geq V_{SG}'$$

Figure 10E:
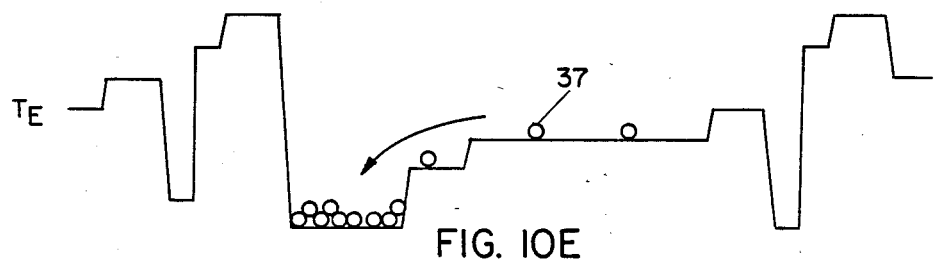

Thereby, the charges 37 on the photosensitive part 15 are transferred to V-CCD 13 as shown in FIG. 10(e).

Figure 10F:
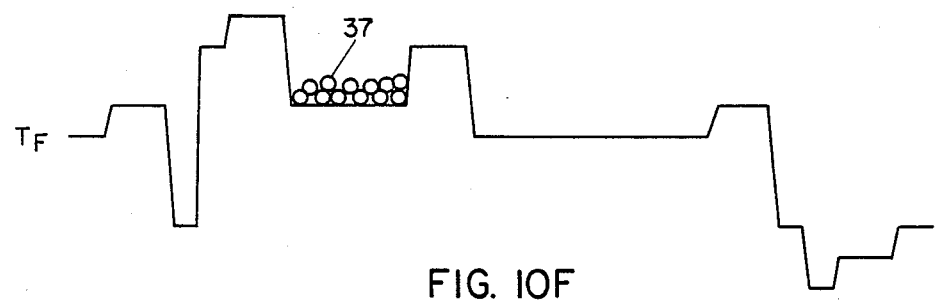

(5) The time $T_F$ indicates the condition at the end of the readout pulse 7 as indicated in FIG. 10(f). Here, it can be stated that the signal charges 37 flowing into V-CCD 13 are generated during the period $\tau$ in FIG. 9. Therefore, the image accumulation time (exposure time) can be considered as $\tau$. The shutter speed can be raised and a stationary image of the moving object can be obtained by the shortening of such a period $\tau$.

It is also an advantage of the present invention in that the limitation on the aperture rate is small (limitation on the light receiving surface is small) in comparison with the arrangement of the reset electrode on the overflow control gate 16.

It is desirable that said reset operation is carried out during the vertical blanking period in the scanning of the display screen.

I claim:

1. A solid state image pickup device for producing a picture signal, said device comprising:

a semiconductor substrate the bulk of which is formed of a semiconductor material of one conductivity type of relatively low doping over which extends a film of an oxide of said semiconductor material and within which are included a plurality of picture element regions spaced apart by channel stop regions, each picture element extending between first and second channel stop regions each of said one conductivity type and of relatively high doping and including in succession therebetween a region which includes a surface layer of conductivity type opposite said one conductivity type and of relatively low doping overlying a layer of said one conductivity type of relatively high doping providing an input to a vertical shift register, a readout gate region of said one conductivity type of relatively low doping, a photosensitive region of said one conductivity of relatively low doping for generating charge corresponding to the intensity of light incident thereon, an overflow control gate region of said one conductivity type of relatively low doping, and an overflow drain region of said opposite conductivity type and of relatively high doping, each said picture element region having associated therewith a first electrode overlying said oxide film and extending over and defining said first channel stop region, the region providing the input to the vertical shift register and the readout gate region, and a reset electrode overlying said oxide film and extending over and defining the overflow control gate region, said reset electrode being responsive to application thereto of a reset voltage pulse at a predetermined time prior to each time that an image-representing signal is read from said device for periodically discharging charge accumulated on said photosensitive region to said overflow drain region.

2. A solid state image pickup device for producing a picture signal, said device comprising:

a semiconductor substrate the bulk of which is formed of a semiconductor material of one conductivity type of relatively low doping over which extends a film of an oxide of said semiconductor material and within which are included a plurality of picture element regions spaced apart by channel stop regions, each picture element region extending between first and second channel stop regions and including in succession therebetween a region providing an input to a shift register, a readout gate region, a photosensitive region for generating charges corresponding to the intensity of light incident thereon, an overflow control gate region and an overflow drain region, each channel stop region and the region adjacent thereto providing an input to a vertical shift register comprising a surface layer of conductivity type opposite said one conductivity type and an underlying layer of said one conductivity type and of relatively high doping, said readout gate region and said photosensitive region being of said one conductivity type of relatively low doping, said overflow control gate region being of said one conductivity type of relatively high doping, and said overflow drain region being of said opposite conductivity type of relatively high doping, and a reset electrode overlying said oxide film and extending over and defining that channel stop region which is between the region that provides an input to the vertical shift register and the overflow drain region of the preceding picture element region, said reset electrode being responsive to application thereto of a reset voltage at the start of a constant period before the time a readout pulse used for reading an image from the picture element is applied for discharging charges on said region that provides an input to the vertical shift register to said overflow drain region of the preceding picture element.

3. A charge coupled device (CCD) solid-state pickup element comprising:
  a metal oxide semiconductor (MOS) structure having a semiconductor substrate the bulk of which is formed of semiconductor material of one conductivity type and of relatively low doping over which extends a film of an oxide of said semiconductor material and within which are included in succession between first and second channel stop regions of said one conductivity type and of relatively low doping a region providing an input to a vertical shift register, a
  readout gate region, a light-receiving region, an overflow control gate region, and an overflow drain region,
  a reset electrode overlying said oxide film and extending over said overflow control gate region and responsively to a reset voltage applied thereto discharging to outside the element signal charges that are accumulated while said light-receiving region is irradiated with light, and
  means for applying a reset voltage to said reset electrode at the start of a constant period before the time of application of a readout pulse used for reading an image pickup signal from said CCD solid-state image pickup element, the charges accumulated by irradiation of light thereafter being read as the image pickup signal.

4. A solid state image pickup element comprising:
  a semiconductor substrate the bulk of which is of one conductivity type and of relatively low doping and within which is formed a plurality of separate picture element regions spaced apart by channel stop regions, each picture element region including in succession between first and second channel stop regions a region providing an input to a vertical shift register, a readout gate region, a light receiving region, an overflow control gate region consisting of a region within said semiconductor substrate of said one conductivity type and of relatively low doping, and an overflow drain region, and
  a reset electrode overlying said overflow control gate region.

5. A charge coupled device (CCD) structure having a semiconductor substrate the bulk of which is formed of a semiconductor material of one conductivity type of relatively low doping over which extends a film of an oxide of said semiconductor material and within which are included a plurality of pickup element regions each including in succession between first and second channel stop regions a region providing an input to a vertical shift register, a readout gate region, a light-receiving region, an overflow control gate region, and an overflow drain region, each channel stop region and the region providing an input to the vertical shift register comprising a surface semiconductor layer of conductivity type opposite said one conductivity type and an underlying semiconductor layer of said one conductivity type and of relatively high doping,
  a reset electrode overlying said oxide film and extending over and defining that channel stop region which is between the region the provides an input to the vertical shift register and the overflow drain region of an adjacent pickup element and responsively to a reset voltage applied thereto discharging signal charges on said region that provides an input to the vertical shift register to outside said pickup element through the overflow drain region of said adjacent pickup element, and
  means for applying a reset voltage to said reset electrode at the start of a constant period before the time of application of a readout pulse used for reading an image pickup signal from said CCD solid-state device, the signal charges accumulated in said light-receiving region by irradiation of light thereafter being read as the image signal during a period before application of said readout pulse starting at a time at which signal charges are transferred from said light-receiving region to said region which provides an input to the vertical shift register by a temporary image readout signal applied to said reset electrode.

6. A solid state image pickup element comprising:
  a semiconductor substrate the bulk of which is of one conductivity type and of relatively low doping and within which are formed a plurality of separate picture element regions spaced apart by channel stop regions, each picture element region including in succession between first and second stop regions a region providing an input to a vertical shift register, a readout region, a light receiving region, an overflow control gate region, and an overflow drain region, each channel stop region and the region adjacent thereto that provides an input to the vertical shift register comprising a surface semiconductor layer of conductivity type opposite said one conductivity type and an underlying semiconductor layer of said one conductivity type and relatively high doping, and
  a reset electrode overlying the channel stop region between the region that provides an input to the vertical shift register and the overflow region of an adjacent pickup element.

* * * * *